(12) United States Patent
Cowles et al.

(10) Patent No.: US 7,079,439 B2
(45) Date of Patent: Jul. 18, 2006

(54) LOW POWER AUTO-REFRESH CIRCUIT AND METHOD FOR DYNAMIC RANDOM ACCESS MEMORIES

(75) Inventors: Timothy B. Cowles, Boise, ID (US); Brian M. Shirley, Boise, ID (US); Greg A. Blodgett, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/868,741

(22) Filed: Jun. 14, 2004

(65) Prior Publication Data

US 2004/0268018 A1 Dec. 30, 2004

Related U.S. Application Data

(63) Continuation of application No. 10/056,935, filed on Oct. 18, 2001, now Pat. No. 6,771,553.

(51) Int. Cl.
*G11C 7/00* (2006.01)

(52) U.S. Cl. .................. 365/222; 365/203; 365/230.08

(58) Field of Classification Search ................ 365/222, 365/233, 203, 230.06, 230.08
See application file for complete search history.

(56) References Cited

U.S. PATENT DOCUMENTS

| | | | |
|---|---|---|---|
| 3,359,827 A | 12/1967 | Kirsch | 365/230 |
| 5,262,998 A | 11/1993 | Mnich et al. | 365/222 |
| 5,400,289 A | 3/1995 | Blodgett | 365/222 |
| 5,450,364 A | 9/1995 | Stephens, Jr. et al. | 365/222 |
| 5,627,791 A | 5/1997 | Wright et al. | 365/222 |
| 5,636,173 A | 6/1997 | Schaefer | 365/230.03 |
| 5,787,489 A | 7/1998 | Pawlowski | 711/169 |
| 5,831,467 A | 11/1998 | Leung et al. | 327/319 |
| 5,841,726 A | 11/1998 | Williams et al. | 365/230.03 |
| 5,848,431 A | 12/1998 | Pawlowski | 711/5 |
| 5,881,016 A | 3/1999 | Kenkare et al. | 365/230.03 |
| 5,901,101 A | 5/1999 | Suzuki et al. | 365/222 |
| 5,949,657 A | 9/1999 | Karabatsos | 361/803 |
| 6,014,340 A | 1/2000 | Sawada | 365/233 |
| 6,031,782 A | 2/2000 | Kobashi et al. | 365/228 |
| 6,049,502 A | 4/2000 | Cowles et al. | 365/230.03 |
| 6,115,278 A | 9/2000 | Deneroff et al. | 365/52 |
| 6,172,928 B1 | 1/2001 | Ooishi | 365/222 |
| 6,185,656 B1 | 2/2001 | Pawlowski | 711/104 |
| 6,188,641 B1 | 2/2001 | Uchida | 365/233 |
| 6,205,514 B1 | 3/2001 | Pawlowski | 711/104 |
| 6,215,686 B1 | 4/2001 | Deneroff et al. | 365/52 |
| 6,215,714 B1 | 4/2001 | Takemae et al. | 365/222 |
| 6,233,195 B1 | 5/2001 | Yamazaki et al. | 365/230.03 |
| 6,243,777 B1 | 6/2001 | Pawlowski | 710/107 |
| 6,249,185 B1 | 6/2001 | O'Toole et al. | 330/261 |
| 6,253,298 B1 | 6/2001 | Pawlowski | 711/169 |
| 6,253,340 B1 | 6/2001 | Cowles et al. | 714/718 |
| 6,292,412 B1 | 9/2001 | Kato et al. | 365/194 |

(Continued)

*Primary Examiner*—Tuan T. Nguyen
*Assistant Examiner*—Hien Nguyen
(74) *Attorney, Agent, or Firm*—Dorsey & Whitney, LLP (57) ABSTRACT

A power saving circuit disables input buffers for command and address signals during an auto-refresh of a DRAM. The input buffers are re-enabled at the end of the auto-refresh in a manner that does not cause spurious commands to be generated. The power saving circuit prevents spurious commands by biasing internal command signals to a "no operation" command whenever the input buffers for the command signals are disabled. The DRAM may also be placed in a mode in which it automatically transitions to a low power precharge mode at the end of the auto-refresh to further reduce power consumed by the DRAM.

21 Claims, 6 Drawing Sheets

U.S. PATENT DOCUMENTS

| | | | |
|---|---|---|---|
| 6,292,420 B1 | 9/2001 | Kim et al. | 365/222 |
| 6,304,497 B1 | 10/2001 | Roohparvar | 365/194.04 |
| 6,304,510 B1 | 10/2001 | Nobunaga et al. | 365/230.06 |
| 6,310,819 B1 | 10/2001 | Cowles et al. | 365/230.06 |
| 6,339,552 B1 | 1/2002 | Taruishi et al. | 365/189.05 |
| 6,349,068 B1 | 2/2002 | Takemae et al. | 365/222 |
| 6,351,404 B1 | 2/2002 | Wright et al. | 365/51 |
| 6,359,827 B1 | 3/2002 | Kirsch | 365/230.06 |
| 6,370,662 B1 | 4/2002 | Hamidi | 714/724 |
| 6,373,752 B1 | 4/2002 | Wright et al. | 365/189.05 |
| 6,414,894 B1 | 7/2002 | Ooishi et al. | 365/222 |
| 6,438,055 B1 | 8/2002 | Taguchi et al. | 365/222 |
| 6,449,203 B1 | 9/2002 | Cowles et al. | 365/222 |
| 6,456,542 B1 | 9/2002 | Roohparvar | 365/189.12 |
| 6,483,347 B1 | 11/2002 | Baker | 326/82 |
| 6,499,073 B1 | 12/2002 | Wallach et al. | 710/103 |
| 6,504,787 B1 | 1/2003 | Tsubouchi et al. | 365/230.05 |
| 6,510,099 B1 | 1/2003 | Wilcox et al. | 365/230.06 |
| 6,525,981 B1 | 2/2003 | Ryan | 365/223 |
| 6,529,429 B1 | 3/2003 | Cowles et al. | 365/201 |
| 6,538,473 B1 | 3/2003 | Baker | 326/82 |
| 6,549,479 B1 | 4/2003 | Blodgett | 365/222 |
| 6,552,596 B1 | 4/2003 | Cowles et al. | 327/318 |
| 6,552,955 B1 | 4/2003 | Miki | 365/233 |
| 6,560,158 B1 | 5/2003 | Choi et al. | 365/226 |
| 6,570,804 B1 | 5/2003 | Blodgett | 365/225.7 |
| 6,580,659 B1 | 6/2003 | Roohparvar | 365/233 |
| 6,597,617 B1 | 7/2003 | Ooishi et al. | 365/222 |
| 6,771,553 B1 * | 8/2004 | Cowles et al. | 365/222 |
| 2006/0028904 A1 * | 2/2006 | Pax | 365/232 |

* cited by examiner

LOW POWER AUTO-REFRESH CIRCUIT AND METHOD FOR DYNAMIC RANDOM ACCESS MEMORIES

CROSS-REFERENCE TO RELATED APPLICATION

This application is a continuation of U.S. patent application Ser. No. 10/056,935, filed Oct. 18, 2001, now U.S. Pat. No. 6,771,553.

TECHNICAL FIELD

This invention relates to dynamic random access memories, and, more particularly, to a circuit and method for reducing the power consumed by such memories when operating in an auto-refresh mode.

BACKGROUND OF THE INVENTION

The power consumed by integrated circuits can be a critical factor in their utility in certain applications. For example, the power consumed by memory devices used in portable personal computers greatly affects the length of time they can be used without the need to recharge batteries powering such computers. Power consumption can also be important even where memory devices are not powered by batteries because it may be necessary to limit the heat generated by the memory devices.

In general, memory device power consumption increases with both the capacity and the operating speed of the memory devices. The power consumed by memory devices is also affected by their operating mode. A dynamic random access memory ("DRAM"), for example, will generally consume a relatively large amount of power when the memory cells of the DRAM are being refreshed because rows of memory cells in a memory cell array are then being actuated in the rapid sequence. Each time a row of memory cells is actuated, a pair of digit lines for each memory cell are switched to complementary voltages and then equilibrated, thereby consuming a significant amount power. As the number of columns in the array increases with increasing memory capacity, the power consumed in actuating each row increases accordingly. Power consumption also increases with increases in the rate at which the rows of memory cells are actuated. Thus, as the operating speed and capacity of DRAMs continues to increase, so also does the power consumed increase during refresh of memory cells in such DRAMs.

During a DRAM refresh, power is also consumed by components other than those in the memory cell array. For example, DRAM devices generally include a large number of input buffers to couple a large number of control and address lines to internal circuitry. While the DRAM is being refreshed, these input buffers continue to switch responsive to control and address signals applied to their respective inputs. However, during some refresh modes, control and address signals are not used by the DRAM. In an auto-refresh mode, for example, an auto-refresh command is applied to the DRAM. The DRAM thereafter internally performs a refresh operation for a predetermined period of time. During this period, the DRAM does not respond to control and address signals applied to its input buffers. However, the input buffers continue to switch during this time. Switching these large number of input buffers during an auto-refresh cycle wastes power because, as mentioned above, the signals coupled through the input buffers are not used during an auto-refresh cycle.

In the past, attempts have been made to minimize the power consumption of DRAMs during auto-refresh by removing power to all input buffers except input buffers for clock ("CLK") and clock enable ("CKE") signals. However, leaving the input buffer for the clock active causes the input buffer to consume a significant amount of power during the auto-refresh period since the input buffer toggles with each clock signal transition. Power could be significantly reduced by removing power to the input buffer for the clock signal during the auto-refresh period. But doing so could cause spurious commands to be registered at the conclusion of the auto-refresh period. As is known in the art, memory commands are typically registered by latching command signals into respective latches responsive to one or both edges of the clock signal. If a clock edge occurs during the time that the input buffers for the command signals are being re-powered after the auto-refresh period, a spurious command corresponding to the transitional states of the input buffers may be registered. Although care can be taken to avoid coupling clock signal transitions to a memory device until re-powering of the input buffers have been completed, a spurious clock signal transition may be generated. A spurious clock signal transition can be generated if the clock signal has a high logic level when the input buffer for the clock signal is re-powered. The spurious clock signal will then register whatever spurious command corresponds to the logic levels at the outputs of the input buffers for the command signals.

In the past, attempts have been made to reduce power during a self-refresh cycle by removing power from the input buffers during the self-refresh period. For a self-refresh command, spurious commands are avoided by first detecting a low-to-high transition of the CKE signal, which signifies the end of the self-refresh. However, the input buffers for the command and address signals are not re-powered at that time. Instead, the output of a small input buffer coupled to the CLK is examined to detect a high-to-low transition of the CLK signal. When the high-to-low transition of the CLK signal is detected, the input buffers for the command and address signals are re-powered so that they will not be in a transitional state by the time the next low-to-high transition of the CLK signal occurs, which is used to register the commands and addresses.

Although the approach described above does reduce power consumption during self-refresh without the risk of registering spurious commands and addresses, this approach is not suitable for use during an auto-refresh cycle. Unlike a self-refresh command, for which the controlling specification allows a delay of two CLK periods to exit the self-refresh cycle, the controlling specification for an auto-refresh command requires the DRAM to be able to register a command occurring on the very next rising edge of the CLK signal. However, the input buffers for the command and address signals may still be in a transitional state at that time, thereby causing spurious command or addresses to be registered.

One approach to minimizing power consumption during an auto-refresh cycle is to remove power from some of the command and address input buffers, but not the input buffers for the clock and clock enable signals, for a predetermined period after the start of an auto-refresh cycle. For example, if an auto-refresh cycle is expected to last 60 nanoseconds, the input buffers might be de-energized for the first 40 nanoseconds. Although this approach does reduce the power consumed during an auto-refresh cycle, it nevertheless still allows a significant amount power to be consumed during the period of time that the input buffers are energized. It is generally not possible to de-energize the input buffers for substantially the entire auto-refresh cycle because the input buffers must be re-powered well before the end of the auto-refresh cycle and the end of the refresh cycle cannot always be predicted with great accuracy. Thus, de-energizing the input buffers for a predetermined period at the start of each auto-refresh cycle still allows the DRAM to consume a significant amount of power.

There is therefore a need for a circuit and method that allows a more significant reduction in the power consumed by DRAMs during an auto-refresh cycle without risk of registering spurious commands or addresses.

SUMMARY OF THE INVENTION

A method and circuit reduces the power consumed by a dynamic random access memory ("DRAM") during an auto-refresh. The DRAM includes a first set of input buffers through which command signals are coupled. The input buffers are disabled during auto-refresh so they do not consume power responding to signals applied to their inputs, and a plurality of command signals are biased to assert a predetermined memory command, such as a "no operation" command. When an internal auto-refresh timer times out, the bias is removed from the command signals, and the input buffers are enabled. In the event the DRAM receives a clock signal, an input buffer through which the clock signal is coupled may also be disabled during the auto-refresh. If so, the input buffer for the clock signal may be re-enabled before re-enabling the input buffers for the command signals so the timing at which the command signal input buffers are re-enabled can be controlled relative to the clock signal. The DRAM may also check the state of a predetermined command signal to transition the DRAM to a low power precharge mode at the conclusion of the auto-refresh.

DETAILED DESCRIPTION OF THE INVENTION

Figure 1:
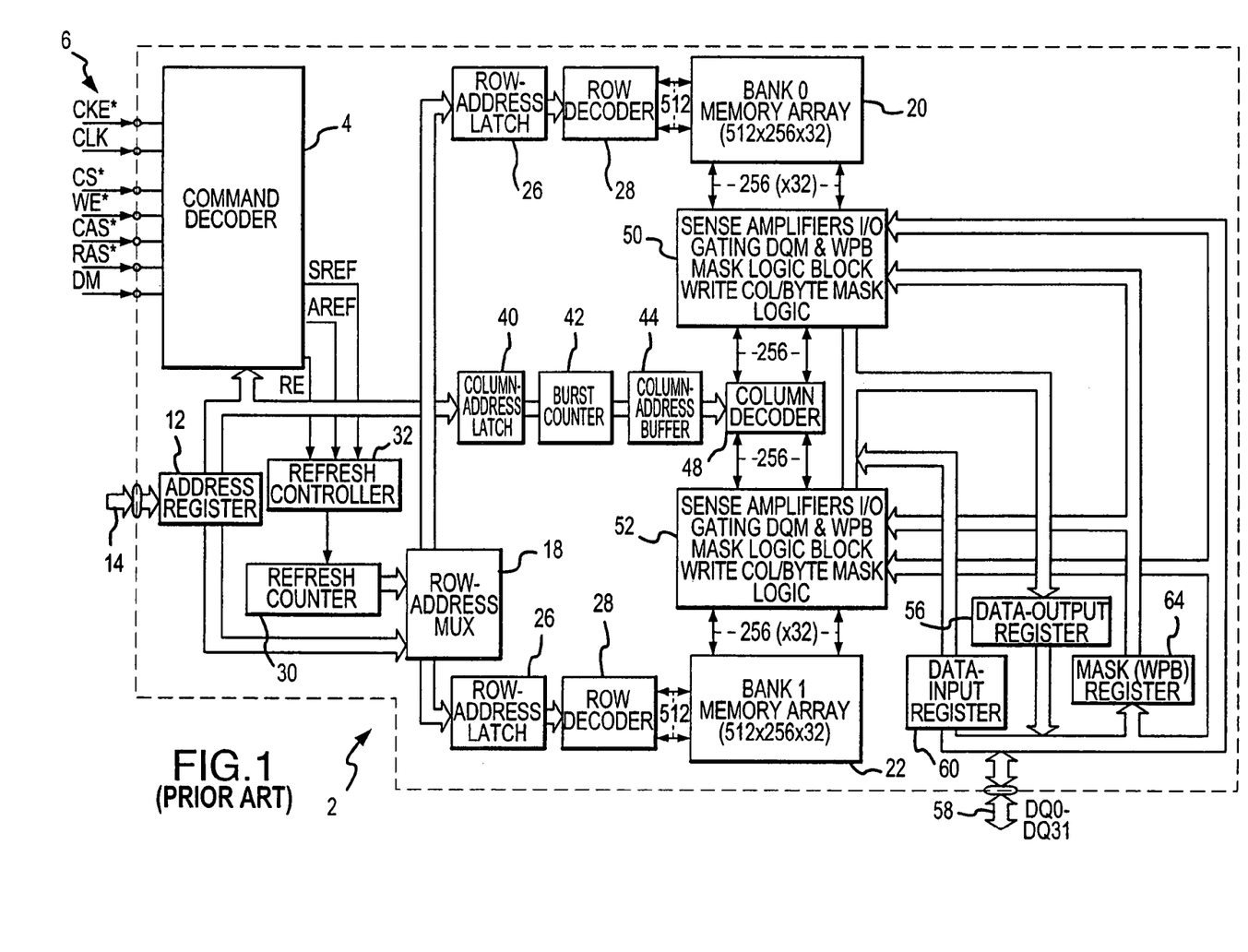
FIG. 1 is a block diagram of a conventional memory device in which the inventive power saving circuit can be used.

FIG. 1 is a block diagram of a conventional synchronous dynamic random access memory ("SDRAM") 2 that can utilize the present invention, including one or more of the embodiments described herein. However, it will be understood that various embodiments of the present invention can also be used in other types of DRAMs. The operation of the SDRAM 2 is controlled by a command decoder 4 responsive to high level command signals received on a control bus 6. These high level command signals, which are typically generated by a memory controller (not shown in FIG. 1), are a clock enable signal CKE*, a clock signal CLK, a chip select signal CS*, a write enable signal WE*, a row address strobe signal RAS*, a column address strobe signal CAS*, and a data mask signal DM, in which the "*" designates the signal as active low. The command decoder 4 generates a sequence of command signals responsive to the high level command signals to carry out the function (e.g., a read or a write) designated by each of the high level command signals. These command signals, and the manner in which they accomplish their respective functions, are conventional. Therefore, in the interest of brevity, a further explanation of these control signals will be omitted.

The SDRAM 2 includes an address register 12 that receives either a row address or a column address on an address bus 14. The address bus 14 is generally coupled to a memory controller (not shown in FIG. 1). Typically, a row address is initially received by the address register 12 and applied to a row address multiplexer 18. The row address multiplexer 18 couples the row address to a number of components associated with either of two memory banks 20, 22 depending upon the state of a bank address bit forming part of the row address. Associated with each of the memory banks 20, 22 is a respective row address latch 26, which stores the row address, and a row decoder 28, which decodes the row address and applies corresponding signals to one of the arrays 20 or 22.

The row address multiplexer 18 also couples row addresses to the row address latches 26 for the purpose of refreshing the memory cells in the arrays 20, 22. The row addresses are generated for refresh purposes by a refresh counter 30, which is controlled by a refresh controller 32. The refresh controller 32 is, in turn, controlled by the command decoder 4. More specifically, the command decoder 4 applies either an auto-refresh command AREF or a self-refresh command SREF command to the refresh controller 32. As explained above, these commands cause the refresh controller to refresh the rows of memory cells in the arrays 20, 22 in one of two corresponding modes, namely an auto-refresh mode or a self-refresh mode. In the auto-refresh mode, the refresh controller 32 causes the SDRAM 2 to address each row of memory cells in the array using the refresh counter 30 to generate the row addresses. Thus, as mentioned above, in the auto-refresh mode, it is not necessary for an external device to apply addresses to the address bus 14 of the SDRAM 2. However, the auto-refresh command must be applied to the SDRAM 2 periodically and often enough to prevent the loss of data stored in the memory cells of the arrays 20, 22. The self-refresh mode is essentially the same as the auto-refresh mode except that it is not necessary to periodically apply a command to the SDRAM 2 from an external device at a rate sufficient to prevent data loss. Instead, once the refresh controller 32 is placed in the self-refresh mode, it automatically initiates an auto-refresh with sufficient frequency to prevent the loss of data from the memory cells of the arrays 20, 22.

The commands applied to the refresh controller 32 correspond to respective combinations of the command signals applied to the command decoder 4. These command signals are CS*, RAS*, CAS* and WE*, and CKE. To assert either the AREF or the SREF command, CS*, RAS*, CAS* must all be active low, and WE* must be inactive high. The CKE signal determines whether the SDRAM 2 will cause the command decoder to generate an auto-refresh command or a self-refresh command. If CKE is high, the command decoder 4 will apply an AREF command to the refresh controller 32. If CKE is low, the command decoder 4 will apply a SREF command to the refresh controller 32. In response to an AREF command, the SDRAM 2 will undergo an auto-refresh cycle and will then wait for another command, which may be another AREF command. In response to an SREF command, the SDRAM 2 will undergo a self-refresh cycle and will continue to do so until the CKE signal transitions high.

After the row address has been applied to the address register 12 and stored in one of the row address latches 26, a column address is applied to the address register 12. The address register 12 couples the column address to a column address latch 40. Depending on the operating mode of the SDRAM 2, the column address is either coupled through a burst counter 42 to a column address buffer 44, or to the burst counter 42 which applies a sequence of column addresses to the column address buffer 44 starting at the column address output by the address register 12. In either case, the column address buffer 44 applies a column address to a column decoder 48, which applies various column signals to corresponding sense amplifiers and associated column circuitry 50, 52 for one of the respective arrays 20, 22.

Data to be read from one of the arrays 20, 22 is coupled to the column circuitry 50, 52 for one of the arrays 20, 22, respectively. The data is then coupled to a data output register 56, which applies the data to a data bus 58. Data to be written to one of the arrays 20, 22 are coupled from the data bus 58 through a data input register 60 to the column circuitry 50, 52 where it is transferred to one of the arrays 20, 22, respectively. A mask register 64 responds to the data mask DM signal to selectively alter the flow of data into and out of the column circuitry 50, 52, such as by selectively masking data to be read from the arrays 20, 22.

Figure 2:
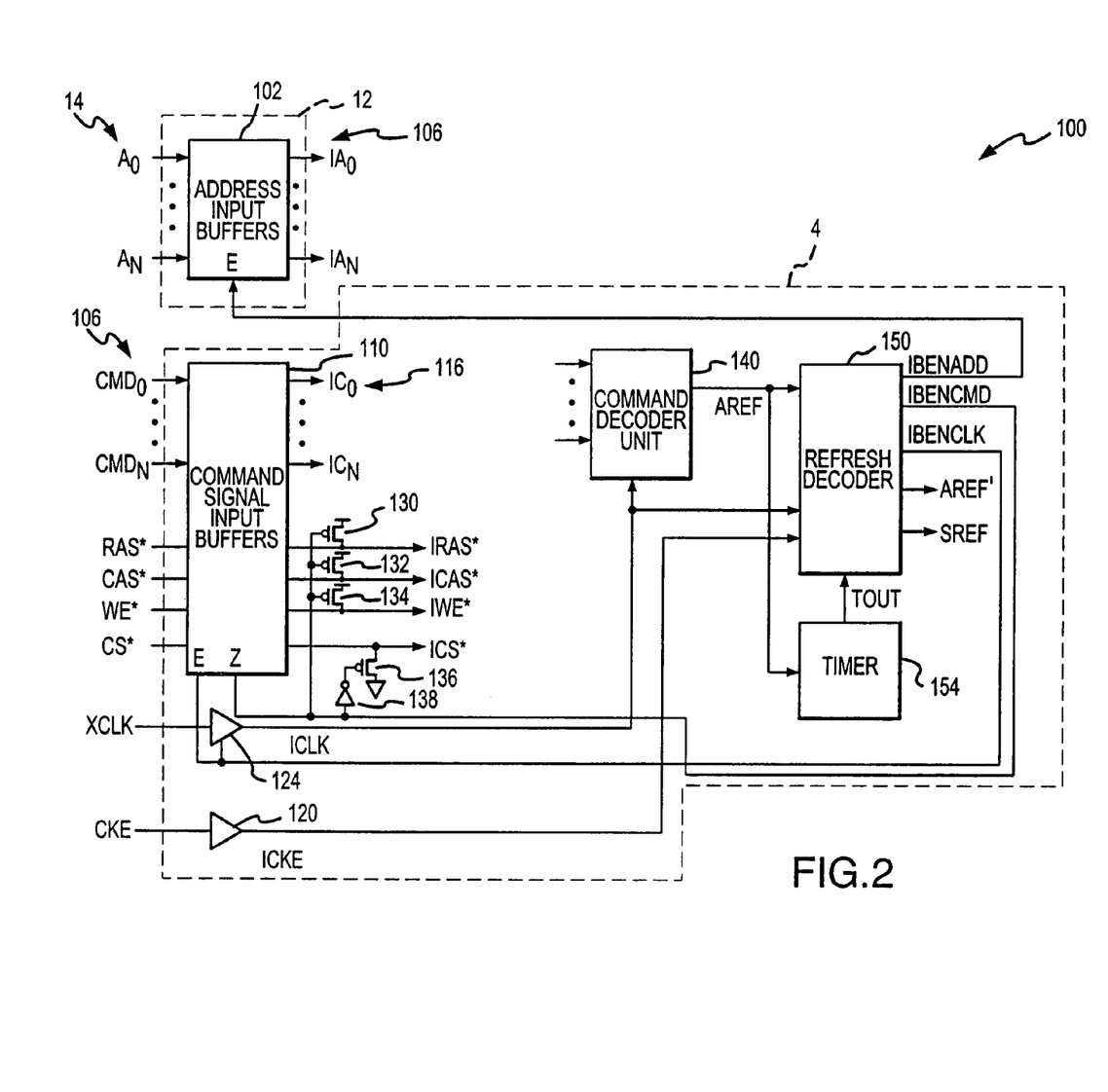
FIG. 2 is a block diagram of one embodiment of a power saving circuit according to the present invention.

One embodiment of a power saving circuit 100 for reducing the power consumption of the SDRAM 2 or some other DRAM during an auto-refresh cycle is shown in FIG. 2. Most of the power saving circuit 100 of FIG. 2 is incorporated in the command decoder 4 of the SDRAM 2 of FIG. 1, but a portion of the power saving circuit 100 is incorporated in the address register 12. However, it will be understood that the power saving circuit 100 shown in FIG. 2 can be placed in other portions of the SDRAM 2 of FIG. 1 or in other types of memory devices.

The power saving circuit 100 includes a first set of input buffers 102 that couple the external address bus 14 to an internal address bus 106 to provide a plurality of internal address bits $IA_0$–$IA_N$ from corresponding external address bits $A_0$–$A_N$. The input buffers 102 are located in the address register 12, although, as explained above, they may also be located elsewhere. The input buffers 102 are enabled by an active high IBENADD signal. Similarly, a second set of input buffers 110 couple the external control bus 6 to an internal control bus 116 to provide a plurality of internal command signals $IC_0$–$IC_N$ from corresponding external command signals. These command signals include an active low address strobe ("RAS*") signal, an active low column address strobe ("CAS*") signal, an active low write enable ("WE*") signal, and an active low chip select ("CS*") signal. An active high clock enable CKE signal is coupled through an input buffer 120 to generate an internal clock enable ("ICKE") signal, and an external clock signal is coupled through an input buffer 124 to generate an internal clock ("ICLK") signal. The input buffers 110 in the second set and the input buffer 124 for the ICLK signal are enabled by an active high IBENCLK signal. The input buffers 110 for the command signals can be switched to a "tri-state" (i.e., a high impedance) condition by a low command input buffer enable IBENCMD applied to the "Z" input of the buffers 110, and to an active low impedance state by a high IBENCMD signal.

The IBENCMD signal is coupled to the gates of several PMOS transistors 130–134, which are coupled between a supply voltage and respective internal command signal lines, and to the input of an inverter 136. The inverter 136, in turn, is coupled to the gate of an NMOS transistor 138, which is coupled between ground and the ICS* signal line. After the input buffers 110 are enabled by a high IBENCLK signal, the IBENCMD signal transitions high to switch the input buffers 110 to a low impedance state and to turn OFF the transistors 130–136 so they do not affect the operation of the power saving circuit 100. When the input buffers 110 are switched to a high impedance state by a low IBENCLK signal, the transistors 130–136 are turned ON to bias high respective internal command signal lines to which they are coupled.

The internal command signals IRAS*, ICAS*, IWE*, ICS*, as well as other internal command signals from the input buffers 110, are applied to a command decoder unit 140. The command decoder unit 140 generates a plurality of memory commands, including an auto-refresh command AREF, from various combinations of the command signals applied to its inputs. As explained above, the AREF command is asserted responsive to decoding IRAS*, ICAS*, and ICS* active low and IWE* inactive high.

The auto-refresh command AREF is applied to a refresh decoder 150 along with the internal clock ICLK signal and the internal clock enable ICKE signal. Based on the state of the ICKE signal, the refresh decoder 150 determines if the AREF command is for an auto-refresh or if it is for a self-refresh. If ICKE is high, the AREF command is interpreted as an auto-refresh command, in which case the refresh decoder 150 passes the AREF command to an output terminal as an AREF' command. If ICKE is low, the AREF command is interpreted as a self-refresh command, in which case the refresh decoder 150 generates a SREF command. The refresh decoder 150 command will continue to generate the SREF command until the ICKE signal transitions high.

The AREF command is also applied to a timer 154, which generates a $T_{OUT}$ pulse after a predetermined period. The $T_{OUT}$ pulse causes the refresh decoder 150 to terminate the AREF' command, thereby terminating the auto-refresh cycle.

All of the input buffers 110, 120, 124 as well as the transistors 130–136, the inverter 138 the command decoder unit 140, the refresh decoder 150 and the timer 154, are shown in FIG. 2 as being located in the command decoder 4. However, as previously mentioned, these components could alternatively be located elsewhere in the SDRAM 2 or in other memory devices.

Figure 3:
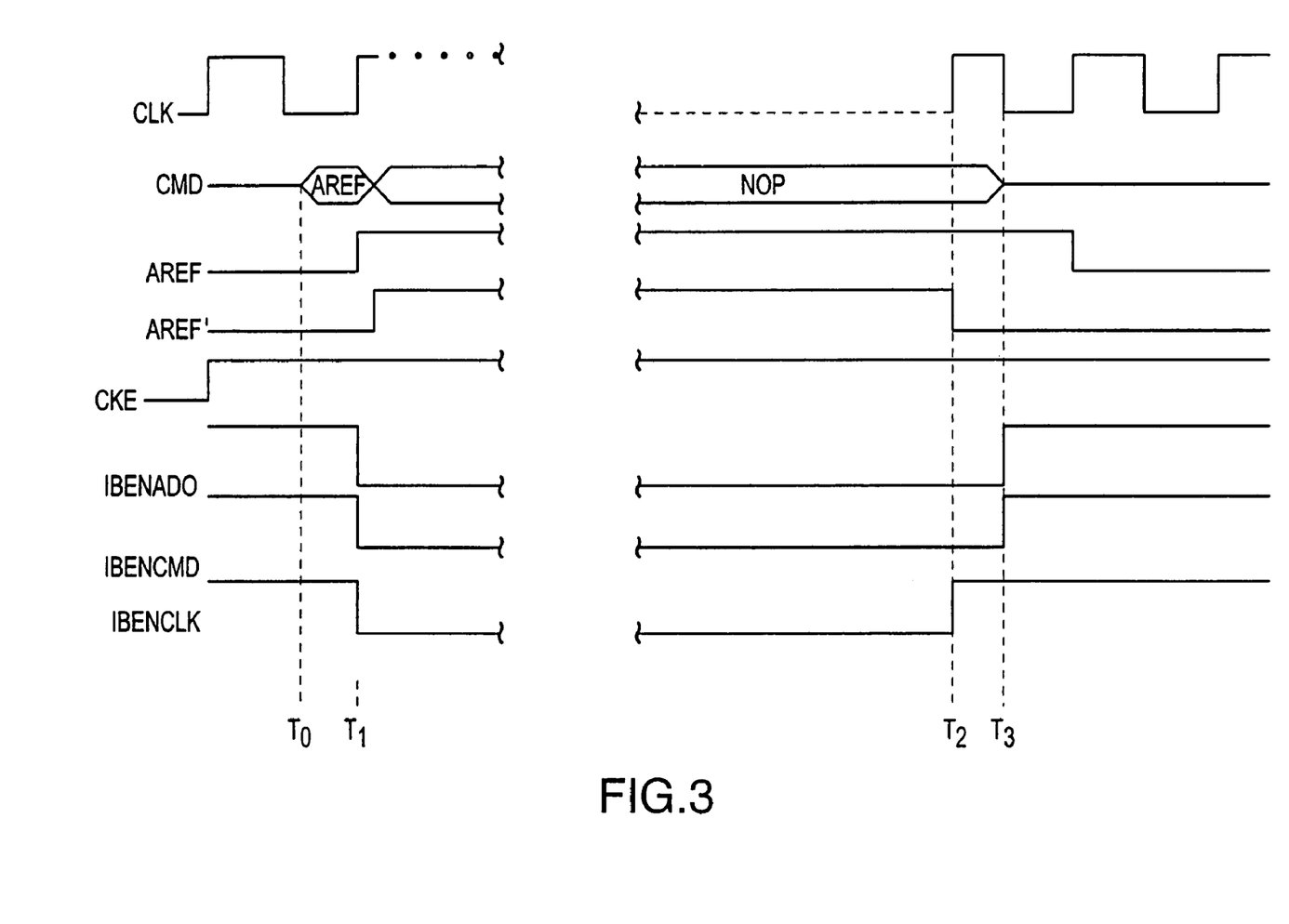
FIG. 3 is a timing diagram showing various signals present in the power saving circuit of FIG. 2.

The operation of the power saving circuit 100 will now be explained with reference to the timing diagram of FIG. 3. The combination of control signals ("CMD") that constitute an auto-refresh AREF command are applied to the SDRAM 2 at time $T_0$ and registered at time $T_1$ by the rising edge of the external clock CLK signal. The external clock enable CKE signal is high at time $T_1$, so the AREF command is registered as an auto-refresh command rather than a self-refresh command. As a result, the command decoder 140 (FIG. 2) generates a high AREF signal and the refresh decoder 150 (FIG. 2) generates a high AREF' signal, rather than a SREF signal, a short time after $T_1$ to initiate the auto-refresh cycle. The AREF command generated by the command decoder unit 140 also triggers the timer 154, which will control the duration of the auto-refresh cycle. In response to the initiation of the AREF signal, the refresh decoder 150 also drives the IBENADD, IBENCMD and IBENCLK signals low, thereby disabling the input buffers 102, 110, 124. The input buffers 102, 110, 124 will thereafter not respond to signal transitions applied to their respective inputs so that they will not consume power even if the signal transitions are rapidly occurring. As a result, the SDRAM 2 consumes relatively little power during the auto-refresh mode. The low IBENCMD signal turns ON the transistors 130–136 thereby maintaining the IRAS*, ICAS*, IWE* signals high and the ICS* signal low during the auto-refresh cycle. Driving these signals in this manner asserts a no operation ("NOP") command. However, since the clock input buffer 124 was disabled by IBENCLK transitioning low at time $T_1$, the command decoder unit 140 does not register and decode these signals as a no operation ("NOP") command.

The timer 154 generates a $T_{OUT}$ pulse at time $T_2$ thereby causing the refresh decoder 150 to transition the AREF' signal low to terminate the auto-refresh cycle. The refresh decoder 150 also drives the IBENCLK signal high at time $T_2$ to couple the CLK signal through the input buffer 124. If the external clock CLK signal is low at time $T_2$, enabling the input buffer 124 will have no effect until the next rising edge of the CLK signal. However, if the CLK signal is high at time $T_2$, enabling the buffer 124 at time $T_2$ will cause the ICLK signal at the output of the input buffer 124 to transition at time $T_2$, which will register the command signals at the output of the input buffers 110 as a valid memory command. However, since the IBENCMD is still low at time $T_2$, the memory command is registered as a NOP command, which will not cause the SDRAM 2 to perform any memory operation. Significantly, the spurious rising ICLK edge will not cause the SDRAM 2 to register a spurious command, which might occur if the IRAS*, ICAS*, IWE*, ICS* signals were not biased to a NOP command. The refresh decoder 150 transitions the IBENCMD signal high a period of time after the IBENCLK signal transitions high. The high IBENCMD signal switches the outputs of the input buffers 110 for the command signals to a low impedance state and turns OFF the transistors 130–136 so the IRAS*, ICAS*, IWE* signals are no longer biased high and the ICS* signal is no longer biased low. As shown in FIG. 3, the refresh decoder 150 also transitions the IBENADD signal high at time $T_3$, although it could transition the IBENADD signal high at time $T_2$ or some other time.

The power saving circuit 100 thus reduces the power consumed by the SDRAM 2 during an auto-refresh cycle, and it does so in a manner that avoids the possibility of a spurious memory command being registered responsive to the input buffers 100 for the command signals being enabled at the conclusion of the auto-refresh period.

Figure 4:
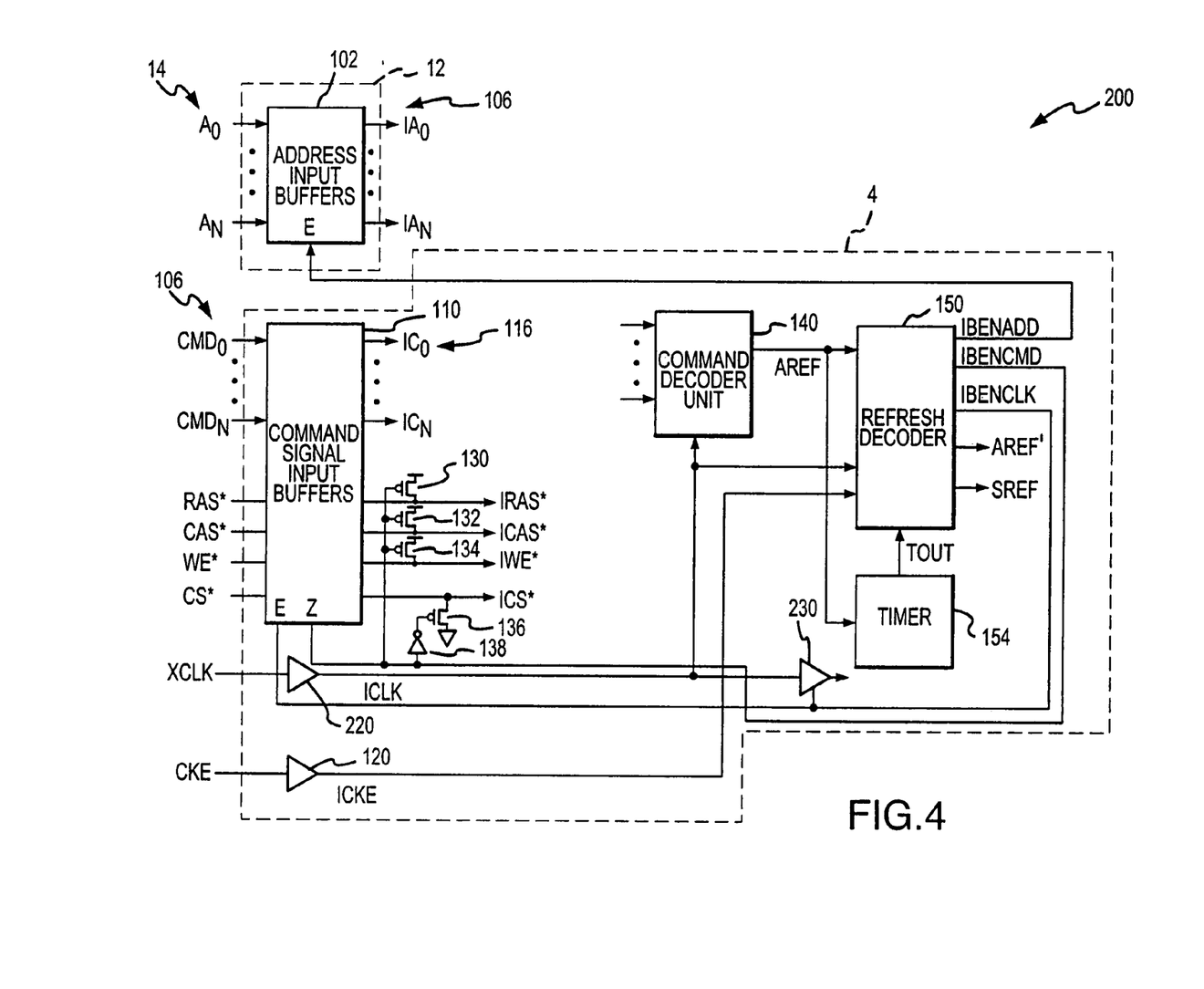
FIG. 4 is a block diagram of another embodiment of a power saving circuit according to the present invention.

Another embodiment of a power saving circuit 200 is shown in FIG. 4. The power saving circuit 200 is substantially identical to the power saving circuit 100 shown in FIG. 2, and it operates in substantially the same manner. Therefore, in the interest of brevity, the circuit components used in the power saving circuit 200 that are identical to the circuit components used in the power saving circuit 100 have been provided with the same reference numerals, and an explanation of their operation will not be repeated. The power saving circuit 200 differs from the power saving circuit 100 by using a permanently enabled input buffer 220 to generate the internal clock ICLK signal from the external clock CLK signal. The power saving circuit also includes an internal clock buffer 230 that is enabled by the IBENCLK signal.

The operation of the power saving circuit 200 is substantially the same as the power saving circuit 100. Specifically, in response to registering an AREF command, the IBENCMD, IBENADD and IBENCLK signals transition low to disable the input buffers 102, 110 and the internal clock buffer 230. As a result, neither the input buffers 102, 110 nor circuitry (not shown) downstream from the internal clock buffer 230 consume power during the auto-refresh cycle initiated in response to the AREF command. However, the input buffer 220 for the clock signal and circuitry in the refresh decoder 150 that responds to the ICLK signal will consume power during the auto-refresh cycle. When the timer 154 times out to generate the $T_{OUT}$ pulse, the refresh decoder 150 can simply wait for half the period of the ICLK signal after the preceding rising edge of the ICLK signal to transition the IBENCMD, IBENADD and IBENCLK signals high. The power saving circuit 200 thus has the disadvantage of consuming more power than the power saving circuit 100 of FIG. 2, but it has the advantage of being able to enable the input buffers 102, 110 without generating a spurious ICLK sianal.

Figure 5:
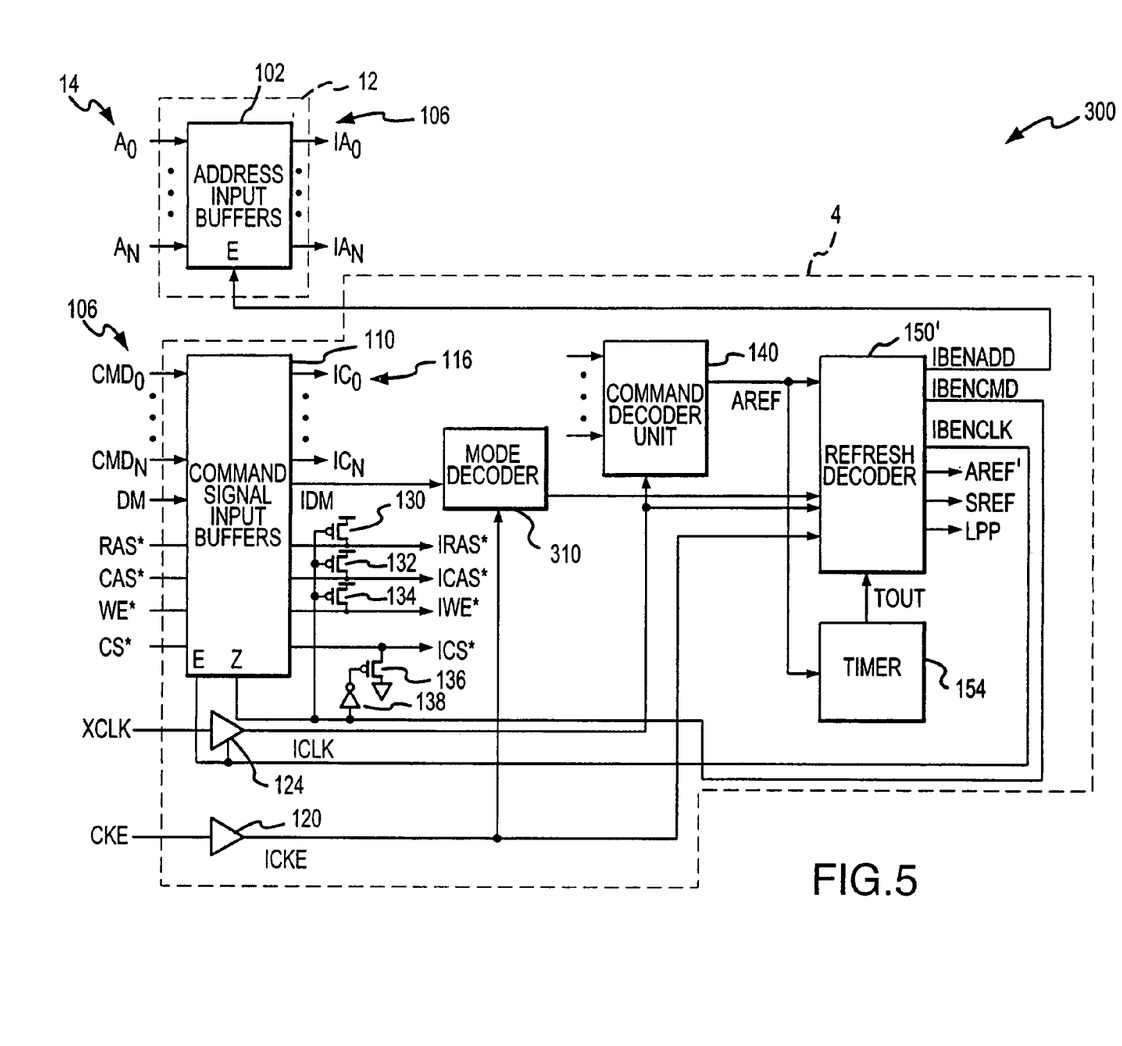
FIG. 5 is a block diagram of still another embodiment of a power saving circuit according to the present invention.

Another embodiment of a power saving circuit 300 is shown in FIG. 5. The power saving circuit 300 is also very similar to the power saving circuit 100 shown in FIG. 2, and it initially operates in substantially the same manner. Therefore, in the interest of brevity, the circuit components used in the power saving circuit 300 that are identical to the circuit components used in the power saving circuit 100 have been provided with the same reference numerals, and an explanation of their operation will not be repeated. The power saving circuit 300 differs from the power saving circuit 100 by allowing the SDRAM 2 to operate in a mode that automatically transitions the SDRAM 2 to a power saving precharge mode at the conclusion of a reduced power auto-refresh cycle. In addition to the components used in the power saving circuit 100 of FIG. 2, the power saving circuit of FIG. 5 includes a mode decoder 310 that decodes the CKE signal and a data mask ("DM") signal applied to a DM input terminal. As explained above, the DM signal is used to mask data being read from or written to the SDRAM 2. Thus, the DM terminal is not needed during a refresh of the SDRAM 2 because data are not being read from or written to the SDRAM 2. Although the DM input terminal is used in the embodiment shown in FIG. 5, it will be understood that some other terminal that is not used during refresh may be used to assert an auto-refresh command.

The mode decoder decodes these signals as follows:

| MODE | DM | CKE |
|---|---|---|
| Low Power AREF Mode With Low Power Precharge | "0" | "0" (for full AREF period) |
| Low Power AREF Mode Without Low Power Precharge | "0" | "1" |
| Normal AREF Mode | "1" | "0" |
| Normal SREF Mode | "1" | "1" |

Thus, if the DM signal is high when the AREF or SREF commands are asserted, the SDRAM 2 operates in a conventional manner. However, if the DM signal is low when the AREF command is asserted, the SDRAM 2 operates in the low power AREF mode described above with reference to FIGS. 2 and 3 regardless of the state of the CKE signal. If the CKE signal is high when the AREF command or at any time during the auto-refresh, when the $T_{OUT}$ pulse is generated to end of the AREF cycle, the SDRAM 2 returns to its normal operating mode to wait for another memory command. However, if the CKE signal is low when the AREF command is asserted and remains low during the entire auto-refresh cycle, the refresh decoder 150' generates an active high low power precharge ("LPP") signal when the $T_{OUT}$ pulse is generated to end of the AREF cycle. Also, in the low power precharge mode, the SDRAM 2 remains in the low power AREF mode so that the refresh decoder 150' does not transition the IBENCMD, IBENADD and IBENCLK signals high at the end of the AREF cycle. Circuitry in the SDRAM 2 (not shown) responds to the high LPP signal to remove power from circuit components in the SDRAM 2 that need not be powered to retain data stored in the memory arrays 20, 22 (FIG. 1). For example, power may be removed from the command decoder 4 (FIG. 1), the column decoder 48, and some of the row decoders 28.

The SDRAM 2 remains in the low power AREF mode as described above and in the low power precharge mode until the CKE signal transitions high. Also, as mentioned previously, if the CKE signal transitions high at any time during the AREF cycle, the active high LPP signal will not be generated at the end of the AREF cycle. When the CKE signal transitions high, the refresh decoder 150' transitions the IBENCMD, IBENADD and IBENCMD signals active high as described above. The refresh decoder 150' also transitions the LPP signal inactive low to re-apply power to circuitry in the SDRAM 2. The low power AREF mode with the LPP mode thus not only minimizes the power consumed by the SDRAM 2 during an auto-refresh cycle, but it also automatically switches the SDRAM 2 to an operating mode at the end of the auto-refresh cycle in which even less power is consumed.

Although the power saving circuit 300 shown in FIG. 5 uses the DM signal to differentiate between low power auto-refresh modes with and without the low power precharge mode, other means of differentiating between these modes can be used. For example, a conventional mode register (not shown) could be programmed with one or more bits during initialization of the SDRAM 2 to indicate a selected operating mode.

Figure 6:
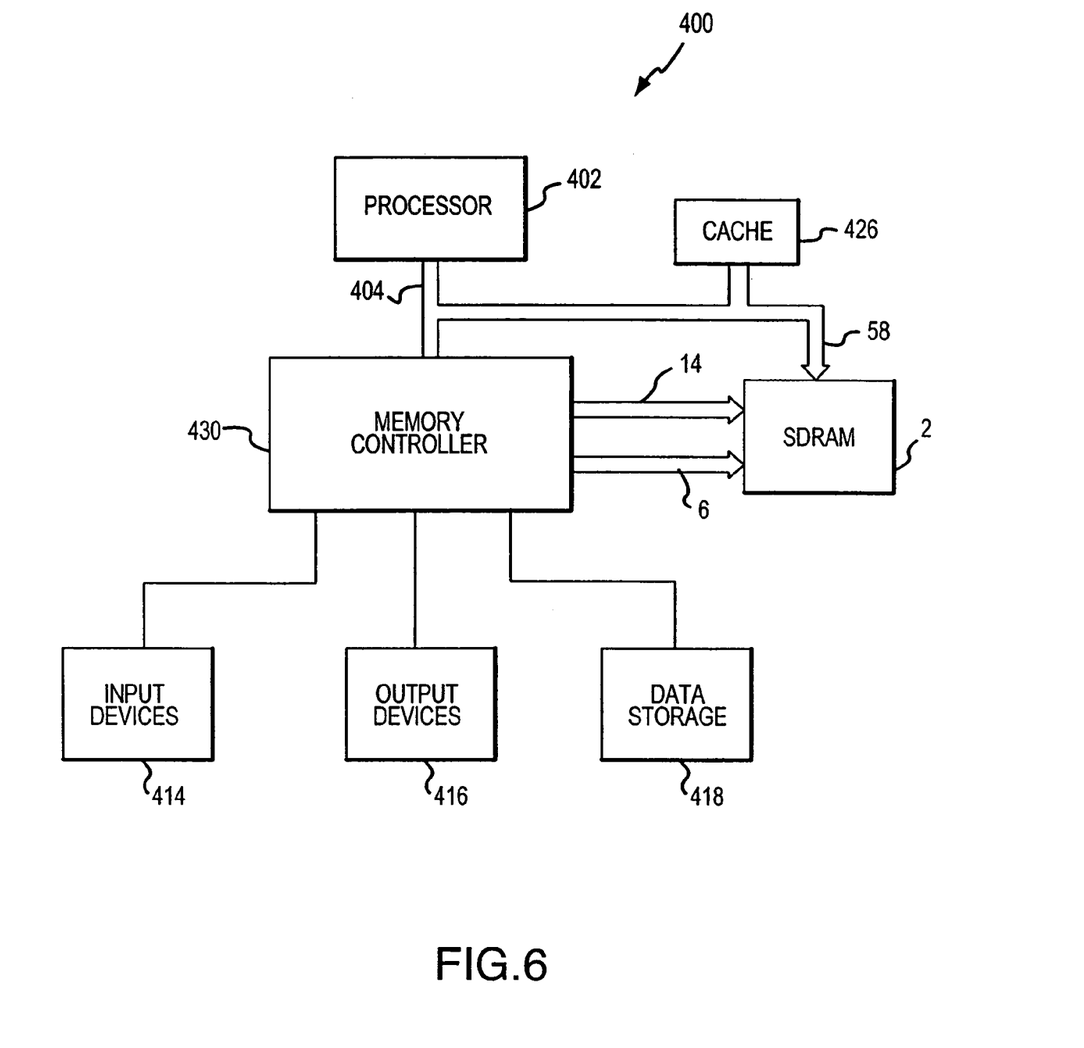
FIG. 6 is a block diagram of a computer system using a memory device containing a power saving circuit according to one embodiment of the present invention.

FIG. 6 shows an embodiment of a computer system 400 that may use the SDRAM 2 or some other memory device that contains an embodiment of a power saving circuit as described herein or some other embodiment of a power saving circuit in accordance with the invention. The computer system 400 includes a processor 402 for performing various computing functions, such as executing specific software to perform specific calculations or tasks. The processor 402 includes a processor bus 404 that normally includes an address bus, a control bus, and a data bus. In addition, the computer system 400 includes one or more input devices 414, such as a keyboard or a mouse, coupled to the processor 402 to allow an operator to interface with the computer system 400. Typically, the computer system 400 also includes one or more output devices 416 coupled to the processor 402, such output devices typically being a printer or a video terminal. One or more data storage devices 418 are also typically coupled to the processor 402 to store data or retrieve data from external storage media (not shown). Examples of typical storage devices 418 include hard and floppy disks, tape cassettes, and compact disk read-only memories (CD-ROMs). The processor 402 is also typically coupled to a cache memory 426, which is usually static random access memory ("SRAM") and to the SDRAM 2 through a memory controller 430. The memory controller 430 includes an address bus coupled to the address bus 14 (FIG. 1) to couple row addresses and column addresses to the DRAM 2, as previously explained. The memory controller 430 also includes a control bus that couples command signals to a control bus 6 of the SDRAM 2. The external data bus 58 of the SDRAM 2 is coupled to the data bus of the processor 402, either directly or through the memory controller 430. The memory controller 430 applies appropriate command signals to the SDRAM 2 to cause the SDRAM 2 to operate in one or more of the power saving modes described above.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A power saving circuit for use in a dynamic random access memory ("DRAM"), comprising:
    a refresh decoder operable to decode at least one command indicative of a refresh of the DRAM and causing the DRAM to be refreshed responsive thereto, the refresh decoder further operable to generate a first refresh signal during the refresh of the DRAM and for a period of time after the refresh, and to generate a second refresh signal at least during the period of time after the refresh;
    at least one input buffer operable to generate an internal command signal from an external command signal applied to at least one input buffer, the input buffer being disabled by the first refresh signal; and
    a bias circuit operable to generate at least one internal command signal responsive to the second refresh signal.

2. The power saving circuit of claim 1 wherein the first refresh signal is generated substantially all during refresh.

3. The power saving circuit of claim 1 wherein the second refresh signal is generated starting at the end of the refresh of the DRAM.

4. The power saving circuit of claim 1 wherein the second refresh signal is generated substantially all during refresh.

5. The power saving circuit of claim 1, further comprising a clock input buffer through which an external clock signal may be applied to generate an internal clock signal, the clock input buffer being disabled by the first refresh signal.

6. A method of reducing power consumption during a refresh cycle of a dynamic random access memory ("DRAM") having a first set of input buffers through which command signals are coupled, the method comprising:
    detecting each of a plurality of memory commands, including a refresh command;
    in response to detecting the refresh command, disabling at least the first set of input buffers, and biasing the outputs of the first set of input buffers;
    detecting a timing command indicative of the end of the refresh cycle;
    in response to detecting the timing command, enabling at least the first set of input buffers while continuing to bias the outputs of the first set of input buffers;
    waiting a period of time after enabling at least the first set of input buffers;
    removing the bias on the outputs of the first set of input buffers at the end of the period of time.

7. The method of claim 6 wherein the act of disabling at least the first set of input buffers comprises removing power from at least the first set of input buffers.

8. The method of claim 6 wherein the act of enabling at least the first set of input buffers comprises re-applying power to at least the first set of input buffers.

9. The method of claim 6 wherein the act of biasing the outputs of the first set of input buffers comprises forcing the outputs of the first set of input buffers to assert a pre-determined state.

10. A dynamic random access memory ("DRAM"), comprising:
a row address circuit operable to receive and decode row address signals applied to an external terminal;
a column address circuit operable to receive and decode column address signals applied to an external terminal;
an array of dynamic random access memory cells operable to store data written to or read from the array at a location determined by the decoded row address signals and the decoded colunm address signals;
a data path circuit operable to couple data signals corresponding to the data between the array and an external data terminal;
a clock input buffer through which an external clock signal is coupled to generate an internal clock signal;
a refresh decoder operable to decode at least one command indicative of a refresh of the DRAM and causing the DRAM to be refreshed responsive thereto, the refresh decoder further operable to generate a first refresh signal during the refresh of the DRAM and for a period of time after the refresh, and to generate a second refresh signal at least during the period of time after the refresh;
at least one input buffer operable to generate an internal command signal from an external command signal applied to at least one input buffer, the input buffer being disabled by the first refresh signal; and
a bias circuit operable to generate at least one internal command signal responsive to the second refresh signal.

11. The dynamic random access memory of claim 10 wherein the clock input buffer is disabled by a third refresh signal, and wherein the refresh decoder is further operable to generate the third refresh signal along with the first and second refresh signals.

12. The dynamic random access memory of claim 10 wherein the bias circuit is operable to force the output of at least one input buffer to assert a pre-determined state.

13. The dynamic random access memory of claim 10 wherein the first refresh signal is generated substantially all during refresh.

14. The dynamic random access memory of claim 10 wherein the second refresh signal is generated starting at the end of the refresh of the DRAM.

15. The dynamic random access memory of claim 10 wherein the second refresh signal is generated substantially all during refresh.

16. A computer system, comprising:
a processor having a processor bus;
an input device coupled to the processor through the processor bus adapted to allow data to be entered into the computer system;
an output device coupled to the processor through the processor bus adapted to allow data to be output from the computer system;
a memory controller generating a row address having a plurality of row address bits followed by a column address having a plurality of column address bits, the memory controller generating an array select signal prior to generating the plurality of column address bits, the array select signal corresponding to a column address bit and having either a first state or a second state; and
a memory device coupled to the memory controller, the memory device comprising:
a row address circuit operable to receive and decoder row address signals applied to an external terminal;
a column address circuit operable to receive and decoder column address signals applied to an external terminal;
an array of dynamic random access memory cells operable to store data written to or read from the array at a location determined by the decoded row address signals and the decoded column address signals;
a data path circuit operable to couple data signals corresponding to the data between the array and an external data terminal;
a refresh decoder operable to decode at least an auto-refresh command and to initiate an auto-refresh cycle responsive thereto, the refresh decoder further operable to generate a first refresh signal during the refresh of the DRAM and for a predetermined period of time after the refresh, and to generate a second refresh signal at least during the predetermined period;
at least one input buffer operable to generate an internal command signal from an external command signal applied to at least one input buffer, the input buffer being disabled by the first refresh signal; and
a bias circuit operable to generate at least one internal command signal responsive to the second refresh signal.

17. The computer system of claim 16 wherein disabling at least one input buffer comprises removing power from at least one input buffer.

18. The computer system of claim 16 wherein the bias circuit is operable to force the output of at least one input buffer to assert a pre-determined state.

19. The computer system of claim 16 wherein the clock input buffer is disabled by a third refresh signal, and wherein the refresh decoder is further operable to generate the third refresh signal along with the first and second refresh signals.

20. The dynamic random access memory of claim 16 wherein the first refresh signal is generated substantially all during refresh.

21. The dynamic random access memory of claim 16 wherein the second refresh signal is generated starting at the end of the refresh of the DRAM.

* * * * *